US006970034B1

(12) United States Patent
Harris

(10) Patent No.: US 6,970,034 B1
(45) Date of Patent: Nov. 29, 2005

(54) METHOD AND APPARATUS FOR REDUCING POWER CONSUMPTION DUE TO GATE LEAKAGE DURING SLEEP MODE

(75) Inventor: David L. Harris, Claremont, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 241 days.

(21) Appl. No.: 10/616,048

(22) Filed: Jul. 7, 2003

(51) Int. Cl.[7] .................................................. G05F 1/10
(52) U.S. Cl. ........................................................ 327/534
(58) Field of Search ................................ 327/530, 534, 327/535, 538, 543

(56) References Cited

U.S. PATENT DOCUMENTS

| | | | | |
|---|---|---|---|---|
| 5,274,601 | A * | 12/1993 | Kawahara et al. | 365/230.06 |
| 2002/0149036 | A1 | 10/2002 | Yabe | 257/207 |
| 2002/0179940 | A1 | 12/2002 | Osada et al. | 257/204 |
| 2003/0062948 | A1 | 4/2003 | Notani et al. | 327/544 |
| 2003/0102904 | A1 | 6/2003 | Mizuno et al. | 327/544 |

* cited by examiner

*Primary Examiner*—Jeffrey Zweizig
(74) *Attorney, Agent, or Firm*—Park, Vaughan & Fleming, LLP; Edward J. Grundler

(57) ABSTRACT

One embodiment of the present invention provides a system that achieves low gate leakage current in an integrated circuit during sleep mode. Upon entering sleep mode, the system reduces the power supply voltage applied to the integrated circuit to a low voltage level, wherein the low voltage level is low enough to provide a low gate leakage current, but is high enough to maintain state in the integrated circuit.

24 Claims, 4 Drawing Sheets

METHOD AND APPARATUS FOR REDUCING POWER CONSUMPTION DUE TO GATE LEAKAGE DURING SLEEP MODE

BACKGROUND

1. Field of the Invention

The present invention relates to the design of CMOS integrated circuits. More specifically, the present invention relates to a method and an apparatus for reducing power consumption due to gate leakage current during sleep mode in CMOS integrated circuits.

2. Related Art

Power consumption in complementary metal oxide semiconductor (CMOS) integrated circuits is made up of a dynamic term and a static term. The dynamic term arises from charging and discharging of load capacitances and is proportional to operating frequency. The static term arises from direct current (DC) flow and is independent of operating frequency. In most digital logic circuits, dynamic power is the dominant term while the chip is active. However, when the clock is stopped and the CMOS device enters a sleep mode to conserve power, static power becomes the dominant term.

The dominant components of this static power consumption are (1) subthreshold leakage currents from source to drain through transistors that are nominally OFF, and (2) gate leakage currents caused by tunneling of carriers through the very thin gate oxides. FIG. 1A illustrates subthreshold leakage current in a negative channel metal-oxide semiconductor (NMOS) transistor. This leakage current, $I_S$, flows from the drain (d) to the source (s) when the transistor is off. FIG. 1B illustrates gate leakage current in an NMOS transistor. This current, $I_G$, flows into the gate due to carriers tunneling across the gate oxide material. In the past, the subthreshold leakage currents have been the dominant component in the static term. However, modern circuits are being built using ever smaller gate thicknesses to improve performance. The effect of these smaller gate thicknesses is to boost the gate leakage term exponentially. FIG. 1C presents a graph illustrating the relative magnitudes of power consumption terms. As shown, dynamic power is increasing gradually with time, while the static power is increasing at a faster rate.

In many design methodologies, the same underlying design is used for system running off of alternating current (AC) or from batteries. The frequency and power supply voltage are typically reduced to cut dynamic power dissipation in battery-based systems. This will become a problem for future systems because the static power dissipation during the low-power sleep mode may unreasonably limit standby life of system such as laptop computers.

Several techniques have been suggested to minimize static power dissipation during sleep mode. Most of these techniques have sought to minimize subthreshold leakage, which has traditionally been the largest static power component. For example, higher threshold devices with less subthreshold leakage may be used, or a body bias may be applied to raise the effective threshold voltage during sleep mode. Unfortunately, these techniques do nothing to reduce gate leakage currents.

Hence, what is needed is a method and an apparatus to effectively reduce gate leakage current in CMOS integrated circuit devices during sleep mode.

SUMMARY

One embodiment of the present invention provides a system that achieves low gate leakage current in an integrated circuit during sleep mode. Upon entering sleep mode, the system reduces the power supply voltage applied to the integrated circuit to a low voltage level, wherein the low voltage level is low enough to provide a low gate leakage current, but is high enough to maintain state in the integrated circuit.

In a variation of this embodiment, the low voltage level is so low that the integrated circuit cannot perform computation operations on data.

In a variation of this embodiment, the low voltage level is below a threshold voltage for transistors on the integrated circuit.

In a variation of this embodiment, when the system detects that sleep mode is about to be exited, the system restores the power supply voltage to a nominal operating voltage.

In a further variation, reducing the power supply voltage involves gradually ramping the power supply voltage to the low voltage level to reduce noise caused by the voltage change.

In a further variation, restoring the power supply voltage involves gradually ramping the power supply voltage to the nominal operating voltage to reduce noise caused by the voltage change.

In a further variation, reducing the power supply voltage involves stepping the power supply voltage in discrete steps to the low voltage level to reduce noise caused by the voltage change.

In a further variation, restoring the power supply voltage involves stepping the power supply voltage in discrete steps to the nominal operating voltage to reduce noise caused by the voltage change.

In a further variation, the low voltage level is also low enough to provide a low subthreshold leakage in the integrated circuit.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Power Consumption

Figure 1A:
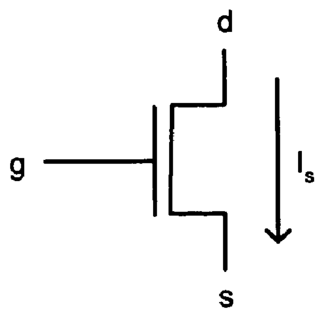
FIG. 1A illustrates subthreshold leakage current in an NMOS transistor.
Figure 1B:
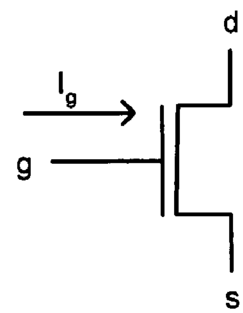
FIG. 1B illustrates gate leakage current in an NMOS transistor.
Figure 1C:
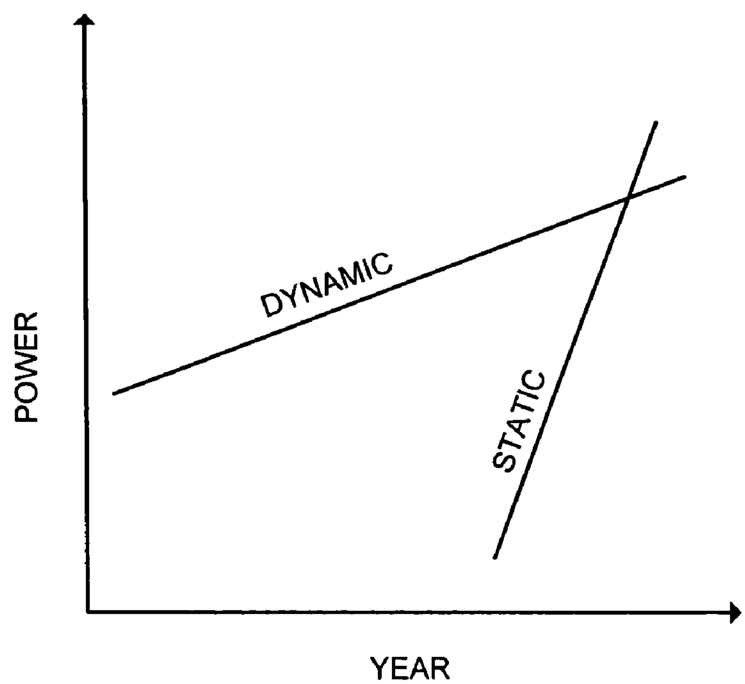
FIG. 1C presents a graph illustrating the relative magnitudes of static and dynamic power consumption components.
Figure 2:
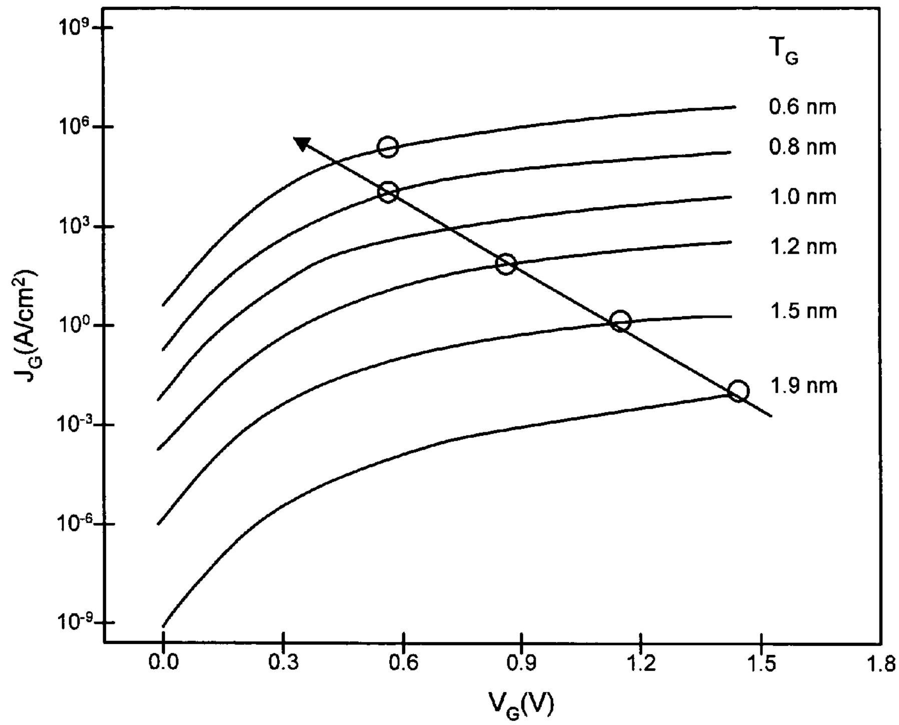
FIG. 2 presents a graph illustrating gate leakage current density versus applied voltage for several gate thicknesses in accordance with an embodiment of the present invention.

FIG. 2 presents a graph illustrating gate leakage current density versus applied voltage for several gate thicknesses in accordance with an embodiment of the present invention. The arrow indicates predicted scaling of oxide thickness ($T_G$) and gate voltage ($V_G$) over various process generations. Note that gate leakage current density ($J_G$) increases exponentially as gate thickness decreases. Note also that the gate leakage current may be reduced by approximately three orders of magnitude by reducing the gate voltage ($V_G$) to approximately 0.3 volts. This voltage level is sufficient to maintain state in a CMOS device while the device is in sleep mode and is not being clocked.

Most integrated circuit devices receive power from an external voltage regulator. In many systems, this regulator is adjustable. For example, some laptop microprocessors use a higher supply voltage for fast operation when the laptop is plugged into an AC source and a lower supply voltage to conserve dynamic power when operation on a battery. This supply voltage can be further reduced during sleep mode until gate leakage current is at an acceptable level.

Ramping to a Lower Voltage

Figure 3:
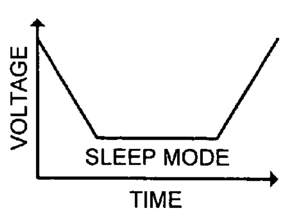
FIG. 3 presents a graph illustrating the process of ramping the power supply voltage to a low voltage level during sleep mode in accordance with an embodiment of the present invention.

FIG. 3 presents a graph illustrating the process of ramping the voltage to a lower level during sleep mode in accordance with an embodiment of the present invention. When the system enters sleep mode, the voltage regulator ramps the voltage to a lower "sleep mode" voltage. Just prior to resuming normal operation, the voltage regulator ramps the voltage up to the nominal voltage for dynamic operation. The rate as which the voltage is ramped up and down can be decided based upon noise tolerance levels for the CMOS circuitry.

Stepping to a Lower Voltage

Figure 4:
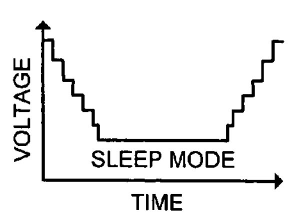
FIG. 4 presents a graph illustrating the process of stepping the voltage to a low voltage level during sleep mode in accordance with an embodiment of the present invention.

FIG. 4 presents a graph illustrating the process of stepping the voltage to a lower level during sleep mode in accordance with an embodiment of the present invention. When the system enters a sleep mode, the voltage regulator steps the voltage in discrete steps to a lower "sleep mode" voltage. Just prior to resuming normal operation, the voltage regulator steps the voltage in discrete steps up to the nominal voltage for dynamic operation. The number and size of the steps can be determined based upon noise tolerance levels for the CMOS circuitry.

Voltage Regulation

Figure 5:
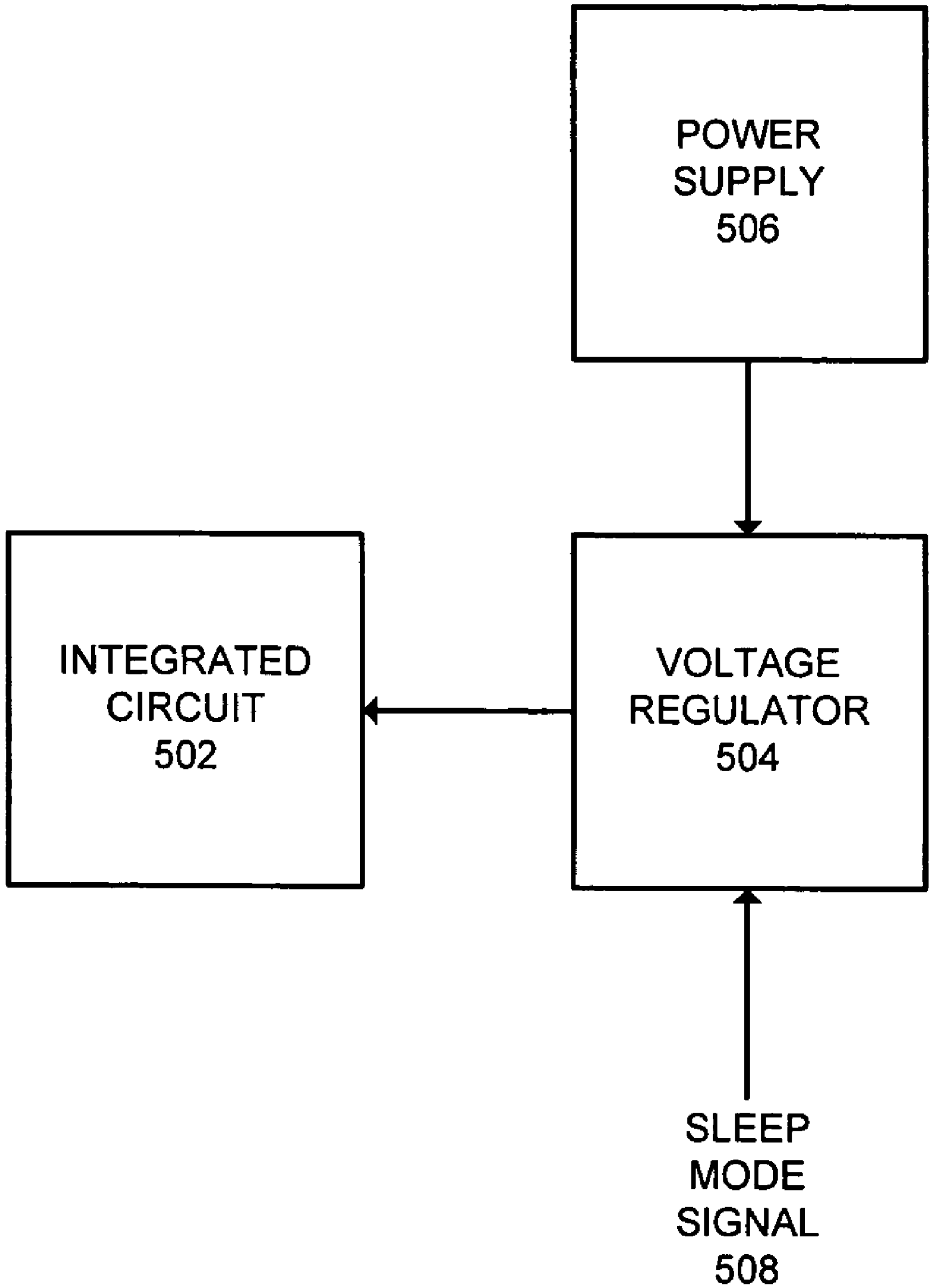
FIG. 5 illustrates a voltage regulation system in accordance with an embodiment of the present invention.

FIG. 5 illustrates a voltage regulation system in accordance with an embodiment of the present invention. This system includes a CMOS integrated circuit 502, a voltage regulator 504, and a power supply 506. Power supply 506 provides DC power for integrated circuit 502 through voltage regulator 504. When voltage regulator 504 receives sleep mode signal 508, voltage regulator reduces the voltage applied to integrated circuit 502 to a low enough level that gate leakage current is reduced, but not so low that integrated circuit 502 cannot maintain state. This low voltage level can, for example, be determined by examining graphs similar to the graph illustrated in FIG. 2. In a variation of this embodiment, voltage is reduced to an even lower level to reduce subthreshold leakage current.

Subthreshold leakage is exponentially dependent on the drain-source voltage $V_{ds}$ and reaches its full value at a few multiples of the thermal voltage $V_t$ (~25 mV at room temperature). However, this leakage may be reduced by lowering the power supply to a voltage on the order of $V_t$. At such low voltage levels, care must be taken that noise does not disturb the system state.

When sleep mode signal 508 is removed prior to resuming normal operation, voltage regulator 504 returns the voltage to the nominal operating level. Note that voltage regulator 504 can either ramp the voltage or step the voltage between the different levels.

Reducing Power Consumption

Figure 6:
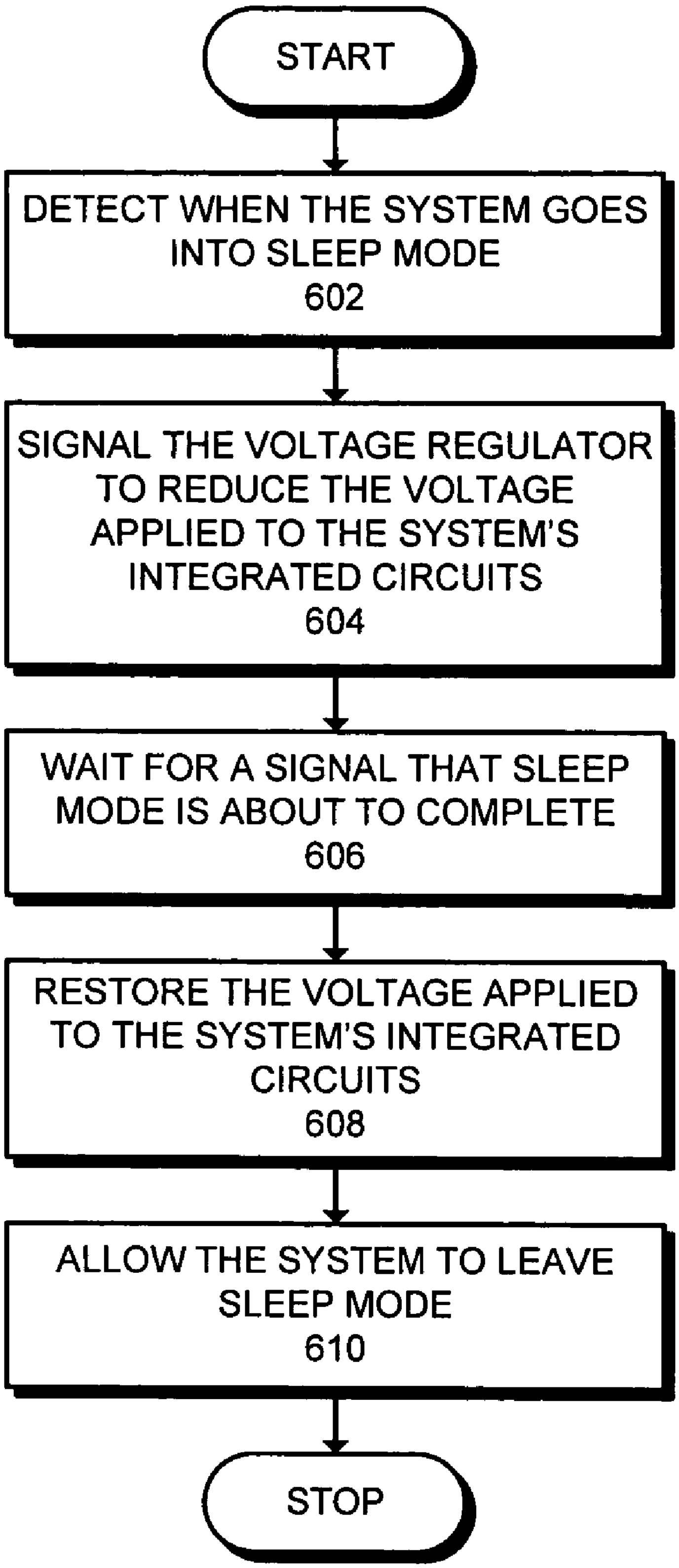
FIG. 6 presents a flowchart illustrating the process of reducing power supply voltage during sleep mode and restoring power supply voltage when sleep mode is terminated in accordance with an embodiment of the present invention.

FIG. 6 presents a flowchart illustrating the process of reducing power supply voltage during sleep mode and restoring the voltage when sleep mode is terminated in accordance with an embodiment of the present invention. The system starts when a signal is detected indicating that the system is going into sleep mode (step 602). Next, the system signals the voltage regulator to reduce the voltage applied to the system's integrated circuits (step 604). In response, the voltage regulator reduces the voltage as described above in conjunction with FIG. 5. The system then waits for a signal that sleep mode is about to complete (step 606).

Upon receiving the signal that sleep mode is about to complete, the system restores the voltage to the system's integrated circuits to a nominal value for operation (step 608). Finally, the system leaves sleep mode and continues normal operation (step 610).

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for achieving low gate leakage current in an integrated circuit during sleep mode, comprising reducing a power supply voltage applied to the integrated circuit to a low voltage level upon entering sleep mode, wherein the low voltage level is low enough to achieve low gate leakage current, but is high enough to maintain state in the integrated circuit, and wherein reducing the power supply voltage involves stepping the power supply voltage in discrete steps to the low voltage level to reduce noise caused by the voltage change.

2. The method of claim 1, wherein the low voltage level is so low that the integrated circuit cannot perform computation operations on data.

3. The method of claim 1, wherein the low voltage level is below a threshold voltage for transistors on the integrated circuit.

4. The method of claim 1, further comprising restoring the power supply voltage to a nominal operating voltage upon detecting that sleep mode is about to be exited.

5. The method of claim 4, wherein reducing the power supply voltage involves gradually ramping the power supply voltage to the low voltage level to reduce noise caused by the voltage change.

6. The method of claim 4, wherein restoring the power supply voltage involves gradually ramping the power supply voltage to the nominal operating voltage to reduce noise caused by the voltage change.

7. The method of claim 4, wherein restoring the power supply voltage involves stepping the power supply voltage in discrete steps to the nominal operating voltage to reduce noise caused by the voltage change.

8. The method of claim 1, wherein the low voltage level is also low enough to provide a low subthreshold leakage current in the integrated circuit.

9. An apparatus for achieving low gate leakage current in an integrated circuit during sleep mode, comprising a reducing mechanism configured to reduce a power supply voltage applied to the integrated circuit to a low voltage level upon entering sleep mode, wherein the low voltage level is low enough to achieve low gate leakage current, but is high enough to maintain state in the integrated circuit, and reducing the power supply voltage involves stepping the power supply voltage in discrete steps to the low voltage level to reduce noise caused by the voltage change.

10. The apparatus of claim 9, wherein the low voltage level is so low that the integrated circuit cannot perform computation operations on data.

11. The apparatus of claim 9, wherein the low voltage level is below a threshold voltage for transistors on the integrated circuit.

12. The apparatus of claim 9, further comprising a restoring mechanism configured to restore the power supply voltage to a nominal operating voltage upon detecting that sleep mode is about to be exited.

13. The apparatus of claim 12, wherein reducing the power supply voltage involves gradually ramping the power supply voltage to the low voltage level to reduce noise caused by the voltage change.

14. The apparatus of claim 12, wherein restoring the power supply voltage involves gradually ramping the power supply voltage to the nominal operating voltage to reduce noise caused by the voltage change.

15. The apparatus of claim 12, wherein restoring the power supply voltage involves stepping the power supply voltage in discrete steps to the nominal operating voltage to reduce noise caused by the voltage change.

16. The apparatus of claim 9, wherein the low voltage level is also low enough to provide a low subthreshold leakage current in the integrated circuit.

17. An integrated circuit that achieves low gate leakage current during sleep mode, comprising a reducing mechanism configured to reduce a power supply voltage applied to the integrated circuit to a low voltage level upon entering sleep mode, wherein the low voltage level is low enough to achieve low gate leakage current, but is high enough to maintain state in the integrated circuit, and wherein reducing the power supply voltage involves stepping the power supply voltage in discrete steps to the low voltage level to reduce noise caused by the voltage change.

18. The integrated circuit of claim 17, wherein the low voltage level is so low that the integrated circuit cannot perform computation operations on data.

19. The integrated circuit of claim 17, wherein the low voltage level is below a threshold voltage for transistors on the integrated circuit.

20. The integrated circuit of claim 17, further comprising a restoring mechanism configured to restore the power supply voltage to a nominal operating voltage upon detecting that sleep mode is about to be exited.

21. The integrated circuit of claim 20, wherein reducing the power supply voltage involves gradually ramping the power supply voltage to the low voltage level to reduce noise caused by the voltage change.

22. The integrated circuit of claim 20, wherein restoring the power supply voltage involves gradually ramping the power supply voltage to the nominal operating voltage to reduce noise caused by the voltage change.

23. The integrated circuit of claim 20, wherein restoring the power supply voltage involves stepping the power supply voltage in discrete steps to the nominal operating voltage to reduce noise caused by the voltage change.

24. The integrated circuit of claim 17, wherein the low voltage level is also low enough to provide a low subthreshold leakage current in the integrated circuit.

* * * * *